(12) United States Patent
Aratake et al.

(10) Patent No.: US 8,013,499 B2
(45) Date of Patent: Sep. 6, 2011

(54) PIEZOELECTRIC VIBRATOR HAVING A PIEZOELECTRIC VIBRATING STRIP IN A CAVITY

(75) Inventors: Kiyoshi Aratake, Chiba (JP); Yasuo Kawada, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/791,286

(22) Filed: Jun. 1, 2010

(65) Prior Publication Data

US 2010/0236038 A1    Sep. 23, 2010

Related U.S. Application Data

(63) Continuation of application No. PCT/JP2008/071570, filed on Nov. 27, 2008.

(30) Foreign Application Priority Data

Dec. 5, 2007   (JP) ................................. 2007-314751

(51) Int. Cl.
    *H01L 41/04*       (2006.01)
    *H01L 41/08*       (2006.01)
(52) U.S. Cl. .................. 310/348; 310/344; 310/370
(58) Field of Classification Search .................. 310/344, 310/348
    See application file for complete search history.

(56) References Cited

U.S. PATENT DOCUMENTS

| | | | | |
|---|---|---|---|---|
| 4,191,905 A | * | 3/1980 | Yasuda et al. .................. | 310/344 |
| 4,293,986 A | * | 10/1981 | Kobayashi et al. .......... | 29/25.35 |
| 4,362,961 A | * | 12/1982 | Gerber ........................... | 310/370 |
| 5,712,523 A | * | 1/1998 | Nakashima et al. ...... | 310/313 R |
| 5,771,555 A | * | 6/1998 | Eda et al. ..................... | 29/25.35 |
| 5,841,217 A | * | 11/1998 | Kizaki et al. ................... | 310/348 |
| 5,925,973 A | * | 7/1999 | Eda et al. ....................... | 310/348 |
| 6,407,485 B1 | * | 6/2002 | Aratake ......................... | 310/344 |

(Continued)

FOREIGN PATENT DOCUMENTS

EP             62604 A1 * 10/1982

(Continued)

OTHER PUBLICATIONS

International Search Report for International Application No. PCT/JP2008/071570, dated Feb. 17, 2009, 2 pages.

*Primary Examiner* — Jaydi San Martin
(74) *Attorney, Agent, or Firm* — Brinks Hofer Gilson & Lione

(57) ABSTRACT

There is provided a method of manufacturing a package 1 having a base substrate 10 and a lid substrate 20 bonded to each other and both formed of a glass base material; and a cavity C formed between the both substrates for storing an encapsulated object 2 in a state of being hermetically encapsulated, including: a depression forming step for forming a depression C1 for a cavity which defines the cavity when the both substrates are superimposed to each other on at least one of the both substrates; and a bonding step for superimposing the both substrates so as to store the encapsulated object in the depression and then bonding the both substrates to encapsulate the encapsulated object in the cavity, characterized in that in the depression forming step, printed layers 12 are laminated on an upper surface of a flat plate-shaped glass base material 11 in a frame shape in plan view by screen printing, and then the printed layers and the glass base material are baked at the same time to form the depression.

16 Claims, 9 Drawing Sheets

U.S. PATENT DOCUMENTS

| | | | |
|---|---|---|---|
| 6,541,897 B2* | 4/2003 | Endoh | 310/344 |
| 6,664,709 B2* | 12/2003 | Irie | 310/313 R |
| 6,703,768 B2* | 3/2004 | Kageyama et al. | 310/344 |
| 7,138,751 B2* | 11/2006 | Sunaba et al. | 310/344 |
| 7,259,501 B2* | 8/2007 | Usuda | 310/344 |
| 7,259,502 B2* | 8/2007 | Kami et al. | 310/353 |
| 7,304,417 B2* | 12/2007 | Masuko et al. | 310/344 |
| 7,439,658 B2* | 10/2008 | Aratake | 310/344 |
| 7,589,458 B2* | 9/2009 | Aratake | 310/370 |
| 7,602,107 B2* | 10/2009 | Moriya et al. | 310/348 |
| 7,605,521 B2* | 10/2009 | Kuwahara | 310/344 |
| 2001/0002807 A1 | 6/2001 | Yoshida et al. | |
| 2004/0135474 A1* | 7/2004 | Koyama et al. | 310/348 |
| 2008/0231145 A1* | 9/2008 | Nagano et al. | 310/344 |
| 2010/0270891 A1* | 10/2010 | Kohda et al. | 310/344 |

FOREIGN PATENT DOCUMENTS

| | | |
|---|---|---|
| JP | 56156014 A * | 12/1981 |
| JP | 06-283951 A | 10/1994 |
| JP | 10-022776 A | 1/1998 |
| JP | 2001-160691 A | 6/2001 |
| JP | 2002-124845 A | 4/2002 |
| JP | 2005-065104 A | 3/2005 |
| JP | 2007-013636 A | 1/2007 |
| JP | 2007-073771 A | 3/2007 |

* cited by examiner

PIEZOELECTRIC VIBRATOR HAVING A PIEZOELECTRIC VIBRATING STRIP IN A CAVITY

RELATED APPLICATIONS

This application is a continuation of PCT/JP2008/071570 filed on Nov. 27, 2008, which claims priority to Japanese Application No. JP2007-314751 filed on Dec. 5, 2007. The entire contents of these applications are incorporated herein by reference.

TECHNICAL FIELD

The present invention relates to a method of manufacturing a package having a cavity for hermetically sealing an encapsulated object, a package manufactured by the manufacturing method, an electronic device using the package, a piezoelectric vibrator, an oscillator having the piezoelectric vibrator, an electronic apparatus, and a radio clock.

BACKGROUND ART

In recent years, various electronic components, for example, a piezoelectric vibrator is used in a mobile phone set or a portable information terminal as a time source or a timing source of a control signal or the like. The piezoelectric vibrator of this type includes various types, and that employing a tip-mount system having a sealed container formed by superimposing a plate-shaped base substrate and a plate-shaped lid portion with each other and a piezoelectric vibrating strip stored in the sealed container is known as one of these types (see Patent Document 1).

The piezoelectric vibrator described in Patent Document 1 has a configuration in which a glass lid portion is superimposed on a glass or ceramics base substrate in a state in which the piezoelectric vibrating strip is stored therebetween, and the base substrate and the lid portion are hermetically bonded by means of anodic bonding or low melting metal or the like.
Patent Document 1: JP-A-6-283951

DISCLOSURE OF THE INVENTION

However, the piezoelectric vibrator in the related art as described above still has the following problem.

In other words, in a case where the base substrate on the side where the piezoelectric vibrating strip is mounted is manufactured, for example, of glass for manufacturing the piezoelectric vibrator in the related art, a number of complicated steps such as a step of forming depressions for a cavity on the side opposing the lid portion by photolithography technique, a step of forming drawn electrodes, a step of forming mount pads for fixing the piezoelectric vibrating strips, and a step of forming a bonding film must be performed, and hence manufacturing efficiency is low at much expense in time and effort, and a cost increase is resulted.

Also, since an isotropic etching method is employed when forming the depression for a cavity on the base substrate, corners are rounded and hence machined surfaces with sharp edges can hardly be achieved. Therefore, it may affect adversely to hermeticity in the interior of the cavity.

In view of such circumstances, it is an object of the present invention to provide a method of manufacturing a package which can achieve manufacturing of a package being superior in hermeticity in a cavity efficiently at a low cost, a package manufactured by the manufacturing method, an electronic device using the package, a piezoelectric vibrator, an oscillator, an electronic apparatus, and a radio clock having the piezoelectric vibrator.

In order to solve the problems as described above, the present invention provides following means.

A method of manufacturing a package according to the present invention is a method of manufacturing a package having a base substrate and a lid substrate bonded to each other and both formed of a glass base material; and a cavity formed between the both substrates for storing an encapsulated object in a state of being hermetically encapsulated, including: a depression forming step for forming a depression for a cavity which defines the cavity when the both substrates are superimposed to each other on at least one of the both substrates; and a bonding step for superimposing the both substrates so as to store the encapsulated object in the depression and then bonding the both substrates to each other to encapsulate the encapsulated object in the cavity, characterized in that in the depression forming step, printed layers are laminated on an upper surface of the flat plate-shaped glass base material in a frame shape in plan view by screen printing, and then the printed layers and the glass base material are baked at the same time to form the depression.

According to the method of manufacturing a package in the present invention, first of all, the depression forming step for forming the depression for a cavity for forming the cavity later on at least one of the base substrate and the lid substrate is performed. Specifically, the glass base material (glass, crystallized glass, or the like) formed into a flat plate-shape in advance is prepared, and the printed layers are printed on the upper surface of the glass base material by performing the screen printing. At this time, the printed layers are laminated by performing the printing by a plurality of times to form the frame shape in plan view. Accordingly, inside portions surrounded by the printed layers become the depressions. Subsequently, the laminated printed layers and the glass base material are baked simultaneously. Accordingly, at least one of the base substrate and the lid substrate on which the depression for a cavity is formed can be fabricated.

Then, the bonding step for superimposing the base substrate and the lid substrate to each other so as to store the encapsulated object in the depression, and then bonding the base substrate and the lid substrate to each other is performed, so that a package in which the encapsulated object is hermetically encapsulated in the cavity can be manufactured.

In particular, since the depression for a cavity is formed by the screen printing, the process step is significantly simplified in comparison with an etching method using photolithography technique in the related art. Therefore, the package can be manufactured efficiently at a low cost. Also, since the depression for a cavity is formed by baking the printed layers formed by printing without using the etching method, machined surfaces with sharp edges at corners are achieved. Therefore, the hermeticity in the cavity can be enhanced, so that the high-quality package can be manufactured.

Also, the method of manufacturing a package according to the present invention is the method of manufacturing a package according to the present invention characterized in that a bonding layer is formed by screen-printing a conductive material on an upper surface of the printed layer at the time of the depression forming step.

In the method of manufacturing a package according to the present invention, the printed layers are printed, and then the conductive material is screen-printed on the upper surface of the printed layers to form the bonding layer. Thereafter, by baking the glass base material, the printed layers, and an electrode layer at the same time, at least one of the base substrate and the lid substrate having the depression for a cavity and the bonding layer can be fabricated. In particular, since the bonding layer is provided on the upper surface of the printed layer, the base substrate and the lid substrate can be bonded by, for example, anodic bonding using the bonding layer in the bonding step. Therefore, the both substrates are bonded firmly, and the hermeticity in the cavity can further be enhanced.

The method of manufacturing a package in the present invention is the method of manufacturing a package according to the present invention characterized in that an electrode layer is formed by screen-printing the conductive material so as to be drawn from the upper surface of the glass base material or the upper surface of the printed layer to a lower surface side of the glass base material at the time of the depression forming step, whereby the inside and outside of the cavity are conducted via the electrode layer.

In the method of manufacturing a package according to the present invention, the electrode layer is formed by screen-printing the conductive material simultaneously when screen-printing the printed layers. At this time, a conductive layer is printed so as to be drawn from the upper surface of the glass base material or the upper surface of the printed layer to the lower surface side of the glass base material. Then, by baking the glass base material, the printed layers, and the electrode layer at the same time, at least one of the base substrate and the lid substrate having the depression for a cavity and the electrode layer can be fabricated. In particular, since the inside and the outside of the cavity can be brought into conduction via the electrode layer after having bonded the both substrates, the encapsulated object stored in the cavity and the outside can be electrically connected. Therefore, the range of application of the encapsulated object can be broadened, and the adaptability as the package can be enhanced.

The method of manufacturing a package according to the present invention is the method of manufacturing a package according to the present invention, characterized in that a deformed layer is formed on the upper surface of the glass base material inside the printed layer to adjust the interior of the cavity into an arbitrary spatial shape by the screen printing at the time of the depression forming step.

In the method of manufacturing a package according to the present invention, the deformed layer is formed by the screen printing simultaneously when screen-printing the printed layers. At this time, the deformed layer is printed on the surface of the glass base material inside the printed layers printed in the frame shape in plan view. Accordingly, the surface of the glass base material can be formed further with projections and depressions. Then, by baking the glass base material, the printed layers, and the deformed layer at the same time, at least one of the base substrate and the lid substrate having the depressions and the projections inside the depression for a cavity can be fabricated.

Therefore, when the cavity is formed by bonding the both substrates, the spatial shape in the cavity can be adjusted relatively freely into an arbitrary spatial shape. For example, a double cavity can be formed. Therefore, the spatial shape in the cavity can be changed according to the encapsulated object, and the adaptability as the package can be enhanced.

A package according to the present invention is characterized by being manufactured by the method of manufacturing a package according to the present invention.

Being manufactured by the manufacturing method described above, the package according to the present invention is superior in hermeticity, increased in quality, and reduced in cost.

An electronic device according to the present invention includes the package according to the present invention described above and an element stored in the cavity.

In the electronic device according to the present invention, since the element is stored in the cavity which is superior in hermeticity, the element is hardly affected by dust or the like, and is operated with high degree of accuracy. Therefore, increase in quality is achieved also as the electronic device. Also, since the package which is reduced in cost is used, reduction in cost of the electronic device is also achieved.

A piezoelectric vibrator according to the present invention includes the package according to the present invention described above and a piezoelectric vibrating strip stored in the cavity.

In the piezoelectric vibrator according to the present invention, since the piezoelectric vibrating strip is stored in the cavity which is superior in hermeticity, the piezoelectric vibrating strip is hardly affected by dust or the like, and is operated with high degree of accuracy. Therefore, increase in quality is achieved also as the piezoelectric vibrator. Also, since the package which is reduced in cost is used, reduction in cost of the piezoelectric vibrator is also achieved.

Also, an oscillator according to the present invention includes the piezoelectric vibrator according to the present invention described above electrically connected to an integrated circuit as an oscillation element.

Also, an electronic apparatus according to the present invention includes the piezoelectric vibrator according to the present invention described above electrically connected to a timer unit.

Also, a radio clock according to the present invention includes the piezoelectric vibrator according to the present invention described above electrically connected to a filtering unit.

In the oscillator, the electronic apparatus, and the radio clock according to the present invention, since the piezoelectric vibrator described above is provided, increase in quality and reduction in cost can be achieved in the same manner.

According to the method of manufacturing a package in the present invention, the high-quality package whose hermeticity in the cavity is high can be manufactured efficiently at a low cost.

Also, being manufactured by the manufacturing method described above, the package according to the present invention is superior in hermeticity, increased in quality, and reduced in cost.

Also, according to the electronic device and the piezoelectric vibrator in the present invention, since the package described above is used, increase in quality and reduction in cost can be achieved.

Furthermore, according to the oscillator, the electronic apparatus, and the radio clock according to the present invention, since the piezoelectric vibrator described above is provided, increase in quality and reduction in cost can be achieved in the same manner.

DETAILED DESCRIPTION OF THE PREFERRED EMBODIMENTS

Referring now to FIG. 1 to FIG. 11, an embodiment of the present invention will be described. In this embodiment, a case where a package is applied to a piezoelectric vibrator will be described as an example.

Figure 1:
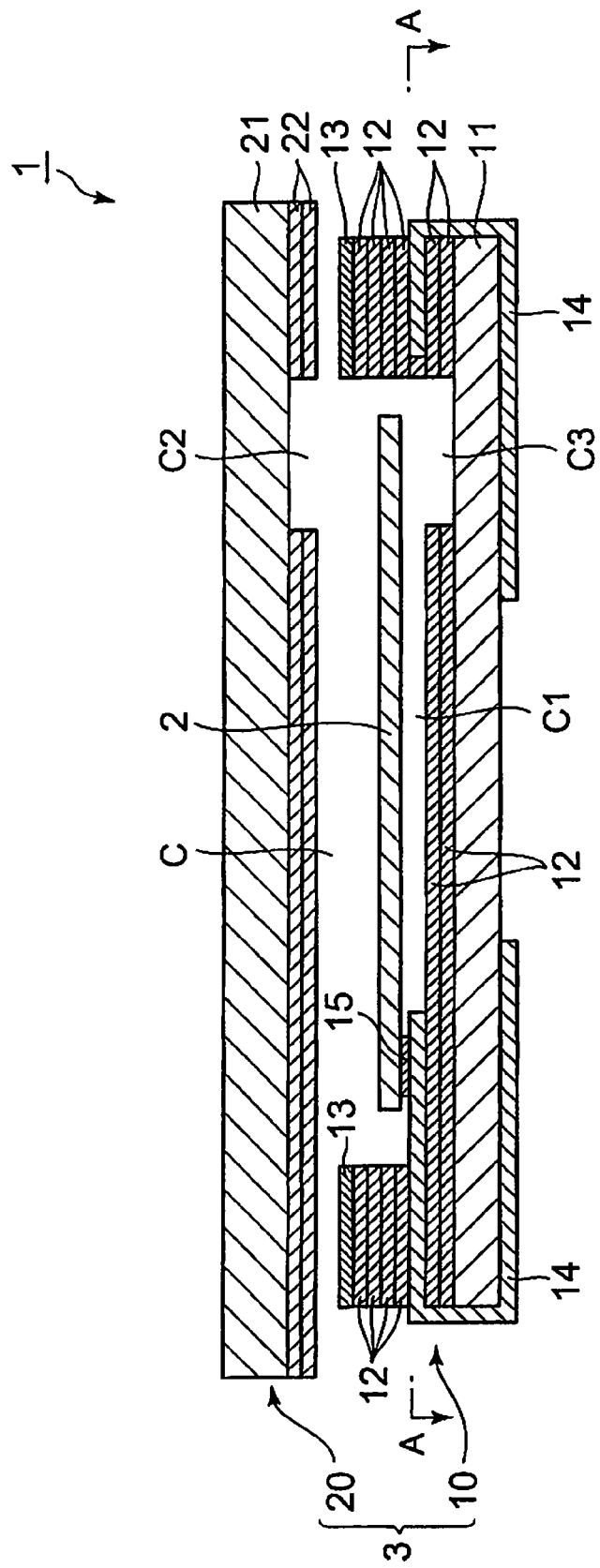
FIG. 1 is a cross-sectional view showing an embodiment of a piezoelectric vibrator according to the present invention.

A piezoelectric vibrator 1 according to this embodiment is a piezoelectric vibrator of a surface-mounted type (two-layer structure type), and includes a piezoelectric vibrating strip 2 and a package 3 having the piezoelectric vibrating strip 2 stored in a cavity C formed in the interior thereof as shown in FIG. 1. In FIG. 1, a state in which a base substrate 10 and a lid substrate 20, described later, are slightly apart from each other is shown for the sake of easy understanding of the drawing.

Figure 2:
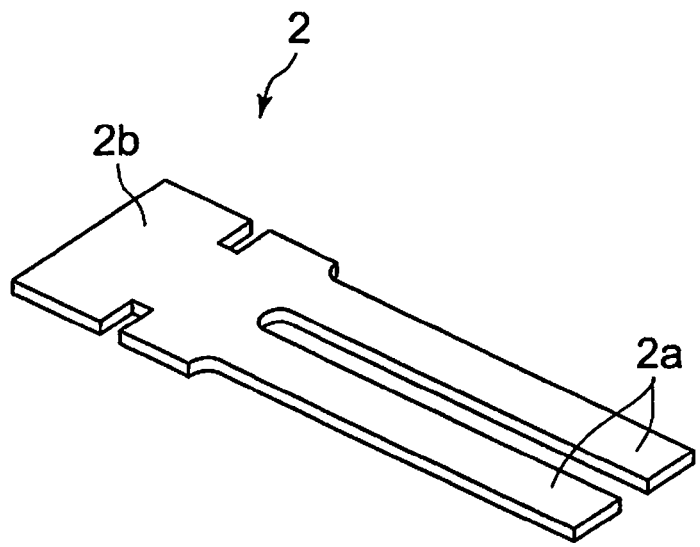
FIG. 2 is a perspective view of a piezoelectric vibrating strip which constitutes the piezoelectric vibrator shown in FIG. 1.

The piezoelectric vibrating strip 2 is a vibrating strip having a tuning fork formed of piezoelectric material such as crystal, lithium tantalite, or lithium niobate as shown in FIG. 2, and is configured to vibrate when a predetermined voltage is applied thereto. In other words, the piezoelectric vibrating strip 2 includes a pair of vibrating arm portions 2a arranged in parallel to each other and a base portion 2b for integrally fixing proximal sides of the pair of vibrating arm portions 2a. Exciting electrodes, not shown, for vibrating the pair of vibrating arm portions 2a in the direction to more toward or away from each other, and mount electrodes, not shown, electrically connected respectively to the exciting electrodes via leading electrodes are patterned on an outer surface of the piezoelectric vibrating strip 2.

These respective electrodes are formed, for example, of films such as conductive films (electrode films) formed of Chrome (Cr), Nickel (Ni), Aluminum (Al), Titan (Ti) or the like.

The package 3 includes the base substrate 10 and the lid substrate 20 bonded to each other and both formed of glass base materials 11, 21, and the cavity C formed between the both substrates 10, 20 for storing the piezoelectric vibrating strip 2 as an encapsulated object in a state of being hermetically encapsulated as shown in FIG. 1.

The cavity C is formed by a combination of two depressions C1, C2 including the depression C1 for a cavity formed on the side of the base substrate 10, and the depression C2 for a cavity formed on the side of the lid substrate 20 and, in this embodiment, it is formed into a double cavity whose depth is changed in the midsection.

The base substrate 10 is integrally formed of the flat plate-shaped glass base material 11, a plurality of printed layers 12, a bonding layer 13, and an electrode layer 14. Those plural printed layers 12, the bonding layer 13, and the electrode layer 14 are all printed on the glass base material 11 by screen printing.

The base substrate 10 will be described further in detail. Two layers of the printed layers 12 are printed in a laminated state on an upper surface of the glass base material 11. At this time, the two printed layers 12 are printed so as to form a depression C3 for protection having a rectangular shape in plan view. The depression C3 for protection is a part of the depression C1.

Figure 3:
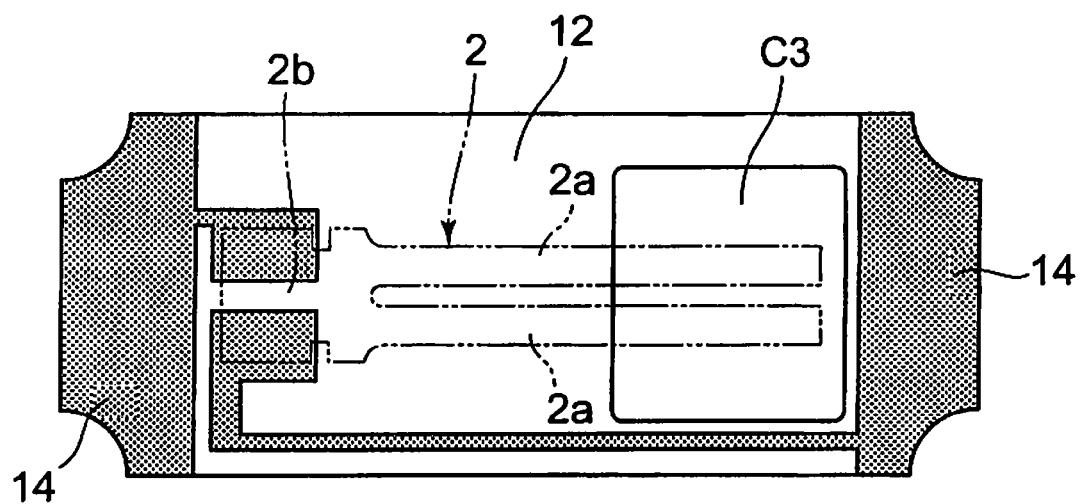
FIG. 3 is a cross-sectional view of the piezoelectric vibrator shown taken along the line A-A in FIG. 1.

Then, a conductive material is screen-printed from an upper surface of the upper printed layer 12 of the two printed layers 12 so as to be drawn to a lower surface side of the glass base material 11, whereby the electrode layer 14 is formed. At this time, as shown in FIG. 3, the electrode layer 14 is printed in a state of being drawn on the printed layers 12 so that parts of it are arranged in parallel below the base portion 2b of the piezoelectric vibrating strip 2 electrically independently.

As shown in FIG. 1, four layers of the printed layers 12 are screen-printed on an upper surface of the electrode layer 14, as shown in FIG. 1. Incidentally, the four printed layers 12 and the two printed layers 12 printed before are printed in a frame shape in plan view, and are configured to function as partitioning portions. Therefore, the inner side of those laminated printed layers 12 functions as the depression C1 for a cavity described above. In addition, since the depression C3 for protection is formed, it is the depression C1 whose depth is changed at the midsection. Also, a conductive material is screen-printed on an upper surface of the upper printed layer 12 of the four printed layers 12, whereby the bonding layer 13 for anodic bonding is formed.

The piezoelectric vibrating strip 2 described above is mounted on the base substrate 10 configured in this manner in a state of being stored in the depression C1. More specifically, the base portion 2b of the piezoelectric vibrating strip 2 is bonded so as to be superimposed on the electrode layer 14 via a connecting portion 15 such as a conductive adhesive agent. Accordingly, the piezoelectric vibrating strip 2 is mounted in a cantilevered state, and the mount electrodes of the piezoelectric vibrating strip 2 and the parts of the electrode layer 14 drawn on the printed layers 12 and arranged in parallel in the state of being electrically independent are electrically connected to each other. Therefore, it is configured in such a manner that the voltage can be applied from the outside to the exciting electrodes of the piezoelectric vibrating strip 2 via the electrode layer 14. In other words, the electrode layer 14 of this embodiment functions as an external electrode.

The glass base material 11, the printed layers 12, the electrode layer 14, and the bonding layer 13 described above are baked at the same time after having ended the screen printing, and are hardened in a state in which the printed shape is maintained. Accordingly, the glass base material 11, the printed layers 12, the electrode layer 14, and the bonding layer 13 are integrally molded and constitute the base substrate 10 as a whole.

The lid substrate 20 includes the glass base material 21 and printed layers 22 screen-printed in two layers on an upper surface of the glass base material 21 in a frame shape in plan view, which are molded integrally. In FIG. 1, since the lid substrate 20 is inverted, a lower surface with respect to a paper plane is described as an upper surface. The two printed layers 22 are printed so as to form the depression C2 having a rectangular shape in plan view. At this time, the printed layers 22 are printed so that the depression C2 opposes the depression C3 for protection on the side of the base substrate 10 when the lid substrate 20 and the base substrate 10 are superimposed with each other. The glass base material 21 and the printed layers 22 are baked at the same time after having ended the screen printing, and are hardened in a state in which the printed shape is maintained. Accordingly, the glass base material 21 and the printed layers 22 are integrally molded and constitute the lid substrate 20 as a whole.

When activating the piezoelectric vibrator 1 configured in this manner, a predetermined voltage is applied to the electrode layer 14 which functions as the external electrode. Accordingly, a current can be flowed to the exciting electrodes via the electrode layer 14, the connecting portion 15, the mount electrodes, and the drawn electrodes, so that the pair of vibrating arm portions 2a can be vibrated at a predetermined frequency in the direction to move toward and away from each other. Then, the vibration of the pair of vibrating arm portions 2a can be used as a time source, a timing source of a control signal, a reference signal source, and so on.

Incidentally, the cavity C of the package 3 is the double cavity whose depth is changed at the midsection. Therefore, even when an external force is applied due to some reason such as an impact with respect to the piezoelectric vibrator 1, and the piezoelectric vibrating strip 2 is excessively bent in the vertical direction, at least distal ends of the vibrating arm portions 2a interfere with the base substrate 10 and the lid substrate 20, and occurrence of deformation, chipping, or the like can be prevented. Therefore, occurrence of fluctuations in frequency can be prevented.

Figure 4:
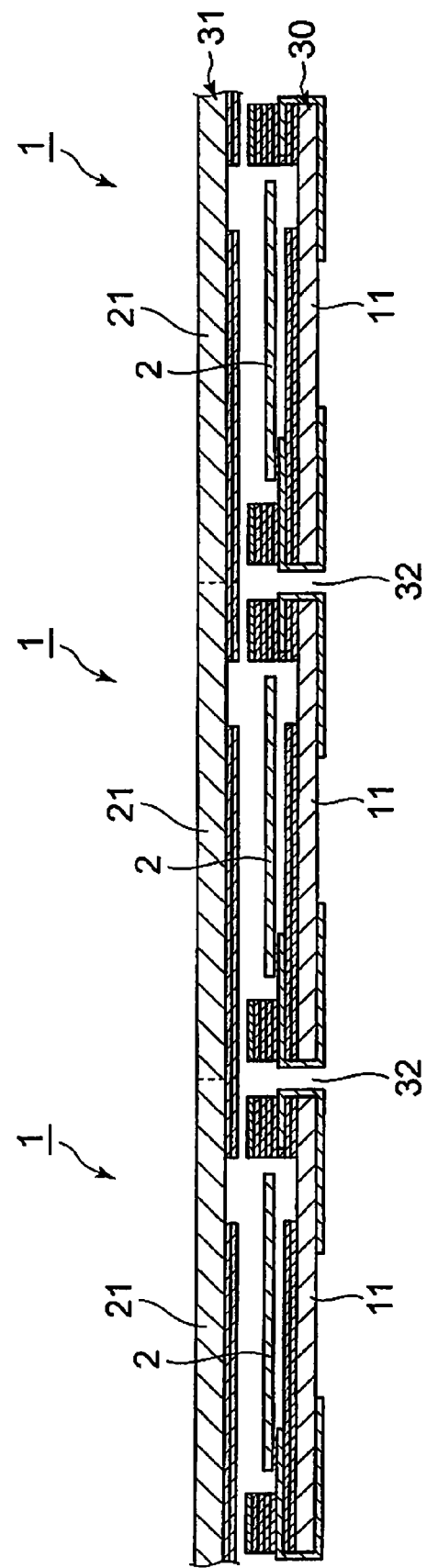
FIG. 4 is a cross-sectional view showing a step of manufacturing the piezoelectric vibrator shown in FIG. 1.

Subsequently, the method for manufacturing the piezoelectric vibrator 1 described above will be described below with reference to FIG. 4 to FIG. 11. In this embodiment, a method of manufacturing a plurality of the piezoelectric vibrators 1 at a time using a flat panel-shaped base wafer 30 which becomes the glass base material 11 of the base substrate 10 and a flat panel-shaped lid wafer 31 which becomes the glass base material 21 of the lid substrate 20 as shown in FIG. 4 will be described. Chain lines shown in FIG. 4 indicate a cutting lines for cutting the both wafers 30, 31 later.

Figure 5:
FIG. 5 is a cross-sectional view showing a step of manufacturing the piezoelectric vibrator shown in FIG. 1 in a state in which through holes are formed in a base wafer.

First of all, as shown in FIG. 5, a plurality of through holes 32 penetrating through the wafer 30 are formed at predetermined positions of the base wafer 30. Subsequently, a depression forming step for forming the depressions C1 for a cavity which define the cavities C is performed.

Figure 6:
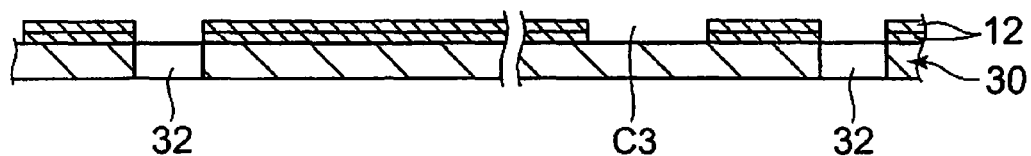
FIG. 6 is a drawing showing a state in which printed layers are screen-printed on an upper surface of the base wafer from the state shown in FIG. 5.
Figure 7:
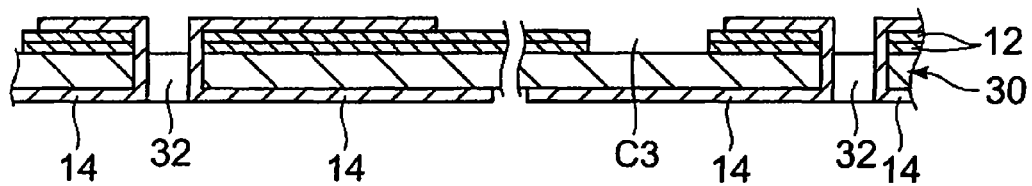
FIG. 7 is a drawing showing a state in which an electrode layer drawn from an upper surface of the printed layer to a lower surface side of the base wafer is screen-printed from the state shown in FIG. 6.

This step will be described in detail. As shown in FIG. 6, the screen printing is performed twice on an upper surface of the base wafer 30 repeatedly to laminate two layers of the printed layers 12. At this time, the printing is performed on an area other than the depressions C3 for protection. Subsequently, as shown in FIG. 7, the conductive material is screen-printed from the upper surface of the upper printed layer 12 of the laminated two printed layers 12 so as to be drawn to a lower surface side of the base wafer 30 via the through holes 32, whereby the electrode layer 14 is formed. At this time, as described above, the electrode layer 14 is printed so that the parts of it are arranged in parallel below the base portions 2b of the piezoelectric vibrating strips 2 electrically independently.

Figure 8:
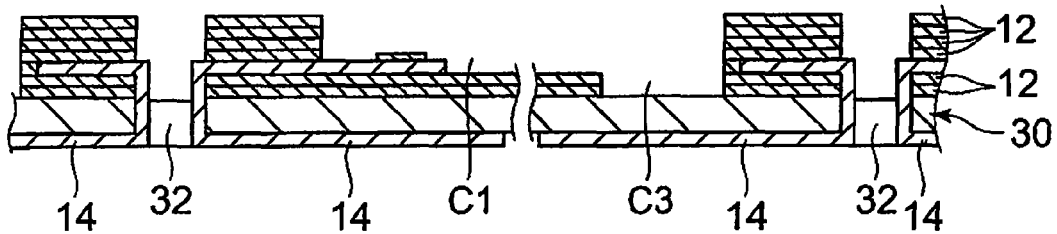
FIG. 8 is a drawing showing a state in which the printed layers are screen-printed on an upper surface of the electrode layer from the state shown in FIG. 7.
Figure 9:
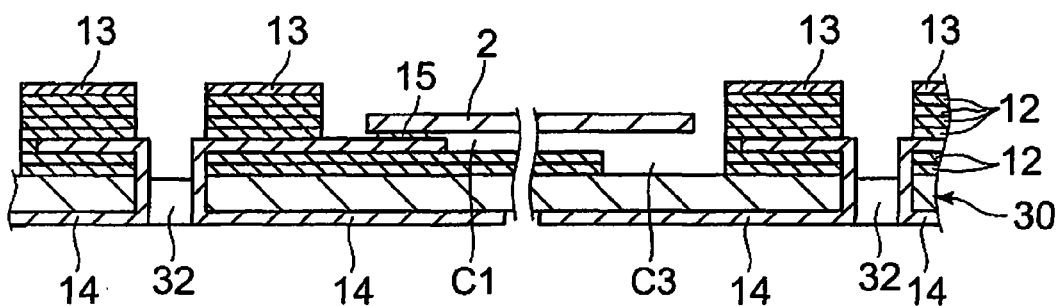
FIG. 9 is a drawing showing a state in which a bonding layer is screen-printed on an upper surface of the printed layer from the state shown in FIG. 8.

Subsequently, as shown in FIG. 8, the screen printing is performed four times on the upper surface of the electrode layer 14 repeatedly to laminate four layers of the printed layers 12. Accordingly, inside portions surrounded by the printed layers 12 become the depressions C1 for a cavity. Subsequently, as shown in FIG. 9, the conductive material is screen-printed on the upper surface of the upper printed layer 12 among the laminated four printed layers 12, whereby the bonding layer 13 is formed.

After having ended the respective screen printings, the base wafer 30, the printed layers 12, the electrode layer 14, and the bonding layer 13 are baked at the same time and hardened. Accordingly, the base wafer 30, the printed layers 12, the electrode layer 14, and the bonding layer 13 are integrally molded, so that the base wafer 30 having the depressions C1 for a cavity is fabricated. Accordingly, the depression forming step for the base wafer 30 is ended.

Subsequently, the depression forming step for forming the depressions C2 for a cavity which define the cavities C is performed also on the lid wafer 31.

Figure 10:
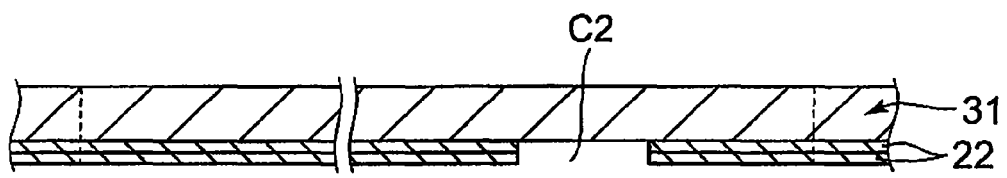
FIG. 10 is a cross-sectional view showing a step of manufacturing the piezoelectric vibrator shown in FIG. 1 in a state in which printed layers are screen-printed on an upper surface of a lid wafer.

This step will be described in detail. As shown in FIG. 10, the screen printing is performed twice on a lower surface of the lid wafer 31 repeatedly to laminate two layers of the printed layers 22. At this time, the printing is performed on an area other than the depressions C2. After having ended the screen printings, the lid wafer 31 and the printed layers 22 are baked at the same time and hardened. Accordingly, the lid wafer 31 and the printed layers 22 are integrally molded and the lid wafer 31 formed with the depressions C2 for a cavity can be fabricated. Accordingly, the depression forming step for the lid wafer 31 is ended.

Subsequently, a bonding step for superimposing the both wafers 30, 31 so as to store the piezoelectric vibrating strips 2 in the depressions C1 for a cavity, and then bonding the both wafers 30, 31 to encapsulate the piezoelectric vibrating strips 2 in the cavities C is performed.

Specifically, as shown in FIG. 9, the piezoelectric vibrating strips 2 are mounted via the connecting portions 15 on the respective parts of the electrode layer 14 formed on the base wafer 30. Accordingly, as shown in FIG. 4, the piezoelectric vibrating strips 2 are stored in a plurality of the depressions C1 formed on a plurality of the base wafers 30 respectively. Subsequently, after having superimposed the both wafers 30, 31 so that the depressions C3 for protection of the base wafer 30 and the depressions C2 of the lid wafer 31 are opposed to each other, the both are bonded to each other by the anodic bonding. In other words, after having heated the both wafers 30, 31 to a predetermined temperature, a predetermined voltage is applied between the bonding layer 13 and the lid wafer 31. Accordingly, the bonding layer 13 is brought into tight contact with the lid wafer 31, and is anodically bonded thereto.

As a result of this bonding step, the piezoelectric vibrating strips 2 can be hermetically encapsulated in the cavities C. Subsequently, the wafer 30 and the lid wafer 31 bonded to each other are cut. In other words, the bonded base wafer 30 and the lid wafer 31 are set to a dicing saw, and are cut into a grid pattern by a dicing blade along lines connecting the through holes 32.

Consequently, the piezoelectric vibrator 1 shown in FIG. 1 can be manufactured.

In particular, in the manufacturing method in this embodiment, since the depressions C1, C2 for a cavity are formed by the screen printing, the process step can be significantly simplified in comparison with an etching method using the photolithography technique in the related art. In addition, since the electrode layer 14 and the bonding layer 13 can be formed by the same screen printing, piezoelectric vibrator can be manufactured in a flow production without necessity of various devices, so that manufacturing efficiency can further be enhanced. Therefore, the package 3 and the piezoelectric vibrator 1 can be manufactured efficiently at a low cost. In addition, since what has to be done is only to bake those formed by screen printing without using the etching method or the like, machined surfaces with sharp edges at corners are achieved. Therefore, since the hermeticity in the interior of the cavity C can be enhanced, and the package 3 and the piezoelectric vibrator 1 of high quality can be manufactured.

Although the case where the base substrate 10 and the lid substrate 20 are anodically bonded using the bonding layer 13 is exemplified in the embodiment described above, the invention is not limited to the anodic bonding. For example, it is also possible to form the bonding layer 13 by screen-printing the predetermined conductive material and bond the both substrates 10, 20 by AuSn eutectic bonding or AuAu thermocompression bonding or the like using the bonding layer 13.

Furthermore, it is also possible to bond the both substrates 10, 20 by surface activation bonding or the like without providing the bonding layer 13.

However, it is more preferable because the bonding method such as the anodic bonding can be applied and the hermeticity in the cavity C can be improved by the firm bonding of the both substrates 10, 20 by using the bonding layer 13.

Figure 11:
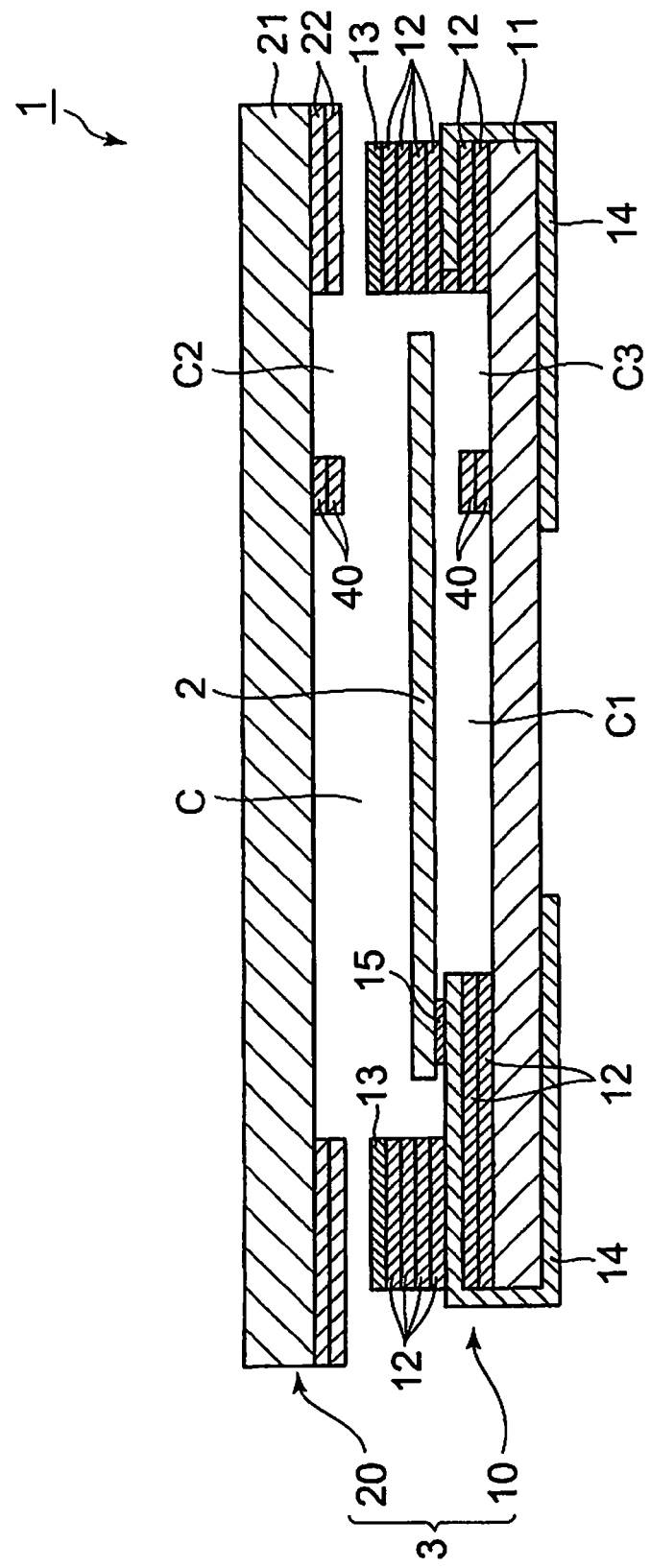
FIG. 11 is a cross-sectional view showing a modification of the piezoelectric vibrator according to the present invention.

Also, although interference of the distal ends of the piezoelectric vibrating strip 2 with respect to the both substrates 10, 20 is prevented by forming the double cavity C by using the change of the lamination of the printed layers 12 in the embodiment described above, it is also possible to prevent the interference by screen-printing deformed layers 40 separately from the printed layers 12, 22 as shown in FIG. 11.

In this case, the deformed layers 40 are printed by the screen printing on the upper surfaces of the glass base materials 11, 21 inside the printed layers 12, 22 when performing the depression forming step. Accordingly, projections and depressions can be formed on the upper surfaces of the glass base materials 11, 21 separately from the printed layers 12, 22. The deformed layers 40 are formed so as to come into contact at positions apart by a given distance from the distal ends of the piezoelectric vibrating strip 2 when the piezoelectric vibrating strip 2 is excessively bent by some reason, and function as pillow portions. Accordingly, the substantially midsection of the piezoelectric vibrating strip 2 comes into abutment with the deformed layers 40 as the pillow portions even when the piezoelectric vibrating strip 2 is excessively bent in the vertical direction, so that the distal ends thereof do not interfere with the both substrates 10, 20.

In this manner, by printing the deformed layers 40, spatial shapes in the cavities C can be adjusted relatively freely to an arbitrary spatial shape, it is possible to cause the printing layers 40 to function as the pillow portions as described above. In particular, by forming the deformed layers 40 as needed according to the encapsulated objects to be hermetically sealed in the cavities C, the spatial shapes in the cavities C can be changed easily and freely, so that the adaptability as the package 3 can be enhanced.

Subsequently, an embodiment of an oscillator according to the present invention will be described with reference to FIG. 12.

Figure 12:
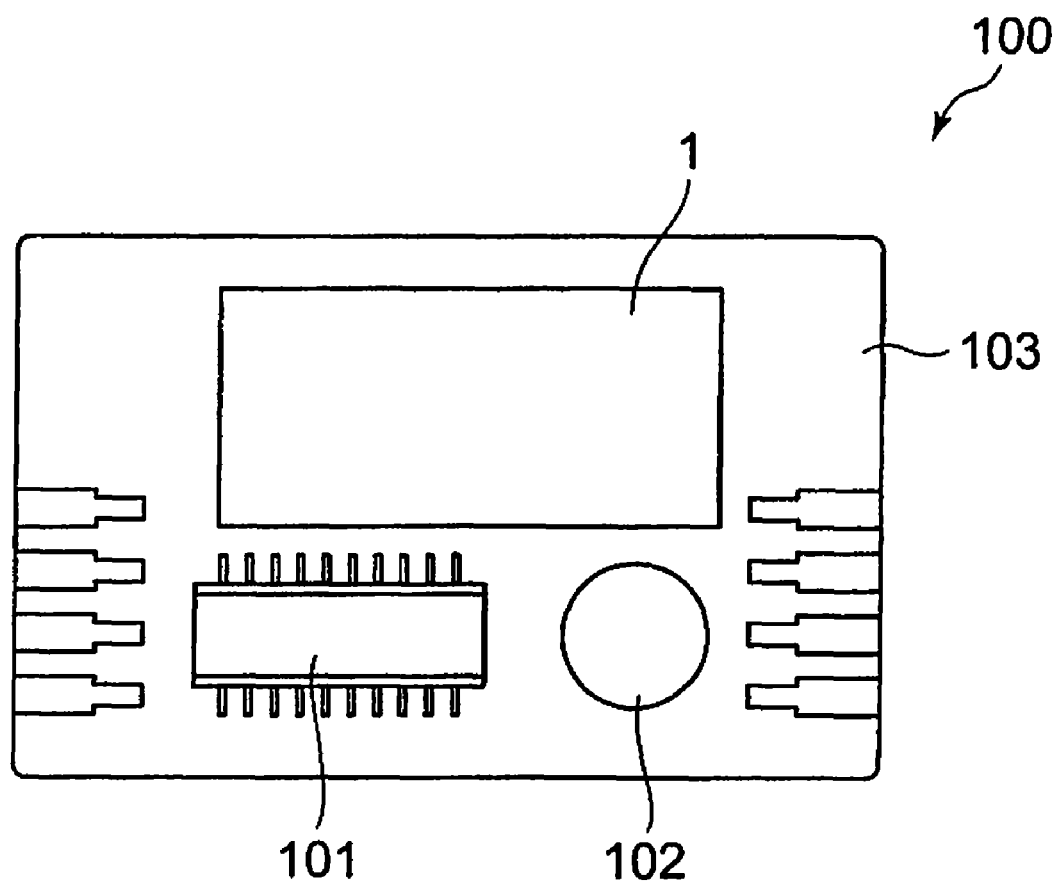
FIG. 12 is a configuration drawing showing an embodiment of an oscillator according to the present invention.

An oscillator 100 in this embodiment includes the piezoelectric vibrator 1 as an oscillation element electrically connected to an integrated circuit 101 as shown in FIG. 12. The oscillator 100 includes a substrate 103 on which an electronic component 102 such as a capacitor is mounted. The integrated circuit 101 as described above for the oscillator is mounted on the substrate 103, and the piezoelectric vibrating strip 2 of the piezoelectric vibrator 1 is mounted in the vicinity of the integrated circuit 101. The electronic component 102, the integrated circuit 101, and the piezoelectric vibrator 1 are electrically connected to each other with a wring pattern, not shown. The respective components are molded by resin, not shown.

In the oscillator 100 configured as described above, when a voltage is applied to the piezoelectric vibrator 1, the piezoelectric vibrating strip 2 in the piezoelectric vibrator 1 vibrates. This vibration is converted into an electric signal by a piezoelectric characteristic of the piezoelectric vibrating strip 2 and is inputted to the integrated circuit 101 as the electric signal. The inputted electric signal is subjected to various sorts of processing by the integrated circuit 101, and is outputted as a frequency signal. Accordingly, the piezoelectric vibrator 1 functions as the oscillation element.

Also, by selectively setting the configuration of the integrated circuit 101, for example, an RTC (real time clock) module or the like according to the requirement, not only a function as a single function oscillator for a clock, but also a function to control the date of operation or the time instant of the corresponding apparatus or an external apparatus or to provide the time instant or a calendar or the like of the same may be added.

As described above, according to the oscillator 100 in this embodiment, since the piezoelectric vibrator 1 improved in quality and reduced in cost is provided, the oscillator 100 by itself is also improved in quality and reduced in cost. In addition, stable and highly accurate frequency signals can be obtained over a long time.

Figure 13:
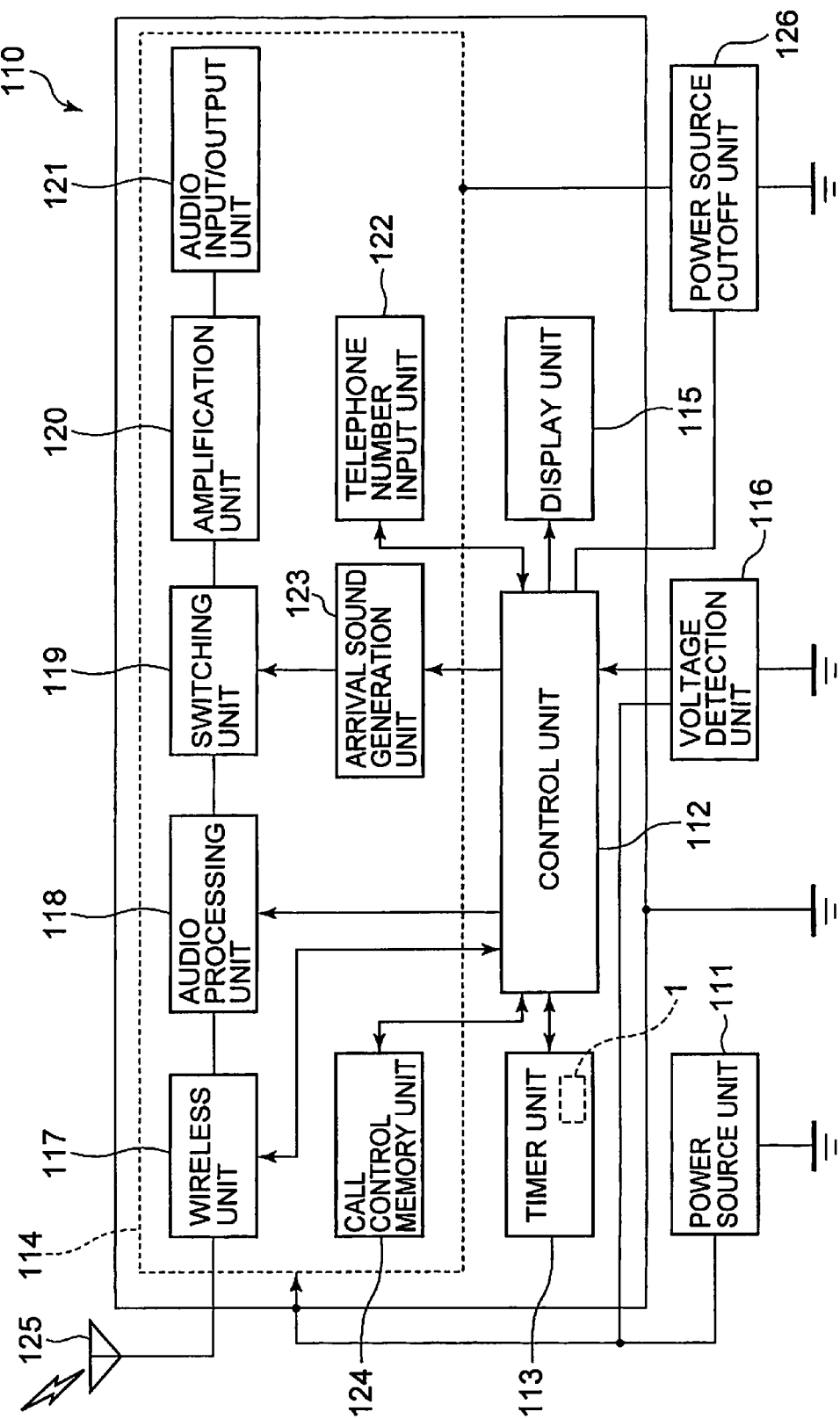
FIG. 13 is a configuration drawing showing an embodiment of an electronic apparatus according to the present invention.

Subsequently, an embodiment of an electronic apparatus according to the present invention will be described with reference to FIG. 13. As the electronic apparatus, a portable information device 110 having the piezoelectric vibrator 1 described above will be exemplified for description. First of all, the portable information device 110 of this embodiment is represented, for example, by a mobile phone set, and development and improvement of a wrist watch in the related art are achieved. The appearance is similar to the wrist watch, a liquid crystal display is arranged on a portion corresponding to an hour plate, so that the current time or the like can be displayed on a screen thereof. When using as a communication instrument, it is removed from the wrist, and the same communication as achieved by the mobile phone set in the related art can be performed with a speaker and a microphone built in an inner portion of a band. However, downsizing and weight reduction are achieved significantly in comparison with the mobile phone set in the related art.

A configuration of the portable information device 110 according to this embodiment will be described. The portable information device 110 includes the piezoelectric vibrator 1 and a power source unit 111 for supplying electric power as shown in FIG. 13. The power source unit 111 is composed, for example, of a lithium secondary battery. The power source unit 111 includes a control unit 112 configured to perform various types of control, a timer unit 113 configured to count the time or the like, a communication unit 114 configured to perform communication with the outside, a display unit 115 configured to display various types of information, and a voltage detecting unit 116 configured to detect the voltage of respective functioning units connected in parallel. The power source unit 111 is configured to supply electric power to the respective functioning units.

The control unit 112 controls the respective functioning units to perform action control of an entire system such as sending and receiving of the voice data, or measurement or display of the current time. Also, the control unit 121 includes a ROM in which a program is written in advance, a CPU configured to read and execute the program written in the ROM, and a RAM used as a work area of the CPU.

The timer unit 113 includes an integrated circuit having an oscillating circuit, a register circuit, a counter circuit, and an interface circuit integrated therein, and the piezoelectric vibrator 1. When a voltage is applied to the piezoelectric vibrator 1, the piezoelectric vibrating strip 2 vibrates, and this vibration is converted into an electric signal by a piezoelectric characteristic of crystal and is inputted to the oscillating circuit as the electric signal. An output from the oscillating circuit is binarized, and is counted by the register circuit and the counter circuit. Then, sending and receiving of the signal with respect to the control unit 112 are performed via the interface circuit, and the current time, the current date, the calendar information, or the like are displayed on the display unit 115.

The communication unit 114 has the same function as the mobile phone set in the related art, and includes a wireless unit 117, a voice processing unit 118, a switching unit 119, an amplifying unit 120, a voice input and output unit 121, a telephone number input unit 122, an incoming call ring tone generating unit 123, and a calling control memory unit 124.

The wireless unit 117 sends and receives various data such as voice data with respect to a base station via an antenna 125. The voice processing unit 118 codes and decodes a voice signal inputted from the wireless unit 117 or the amplifying unit 120. The amplifying unit 120 amplifies the signal inputted from the voice processing unit 118 or the voice input and output unit 121 to a predetermined level. The voice input and output unit 121 includes a speaker and a microphone, and reinforces an incoming call ring tone or a receiving voice, or collects the voice.

Also, the incoming call ring tone generating unit 123 generates the incoming call ring tone according to a call from the base station. The switching unit 119 switches the amplifying unit 120 connected to the voice processing unit 118 to the incoming call ring tone generating unit 123 only at the time of the incoming call, so that the incoming call ring tone generated by the incoming call ring tone generating unit 123 is outputted to the voice input and output unit 121 via the amplifying unit 120.

The calling control memory unit 124 stores the program relating to communication dialing and incoming ring tone control. Also, the telephone number input unit 122 includes, for example, numeral keys from 0 to 9 and other keys, and a telephone number of a call target and the like is entered by pressing these numeral keys and the like.

The voltage detecting unit 116 detects a voltage drop when the voltage applied to the respective functioning units such as the control unit 112 by the power source unit 111 falls below the predetermined value, and notifies it to the control unit 112. The predetermined voltage at this time is a value preset as a minimum voltage for stably operating the communication unit 114 and, for example, is on the order of 3V. The control unit 112, upon reception of the notification about the voltage drop from the voltage detecting unit 116, restricts the operations of the wireless unit 117, the voice processing unit 118, the switching unit 119, and the incoming call ring tone generating unit 123. In particular, the stop of the operation of the wireless unit 117 which consumes a large amount of power is essential. Furthermore, the fact that the communication unit 114 is disabled due to the short of the remaining amount of battery is displayed on the display unit 115.

In other words, the operation of the communication unit 114 may be restricted by the voltage detecting unit 116 and the control unit 112, and this may be displayed on the display unit 115. This display may be a text message, but may be a cross mark on a telephone icon displayed on an upper portion of a display surface of the display unit 115 as a further visceral display.

By providing a power source blocking unit 126 which is capable of selectively disconnecting the power source of a portion relating to the function of the communication unit 114, the function of the communication unit 114 can be stopped further reliably.

As described above, according to the portable information device 110 in this embodiment, since the thinned piezoelectric vibrator 1 is provided, reduction in thickness of the portable information device 110 by itself is achieved. In addition, a stable and highly accurate time information can be displayed over a long time.

Subsequently, an embodiment of a radio clock according to the present invention will be described with reference to FIG. 14.

Figure 14:
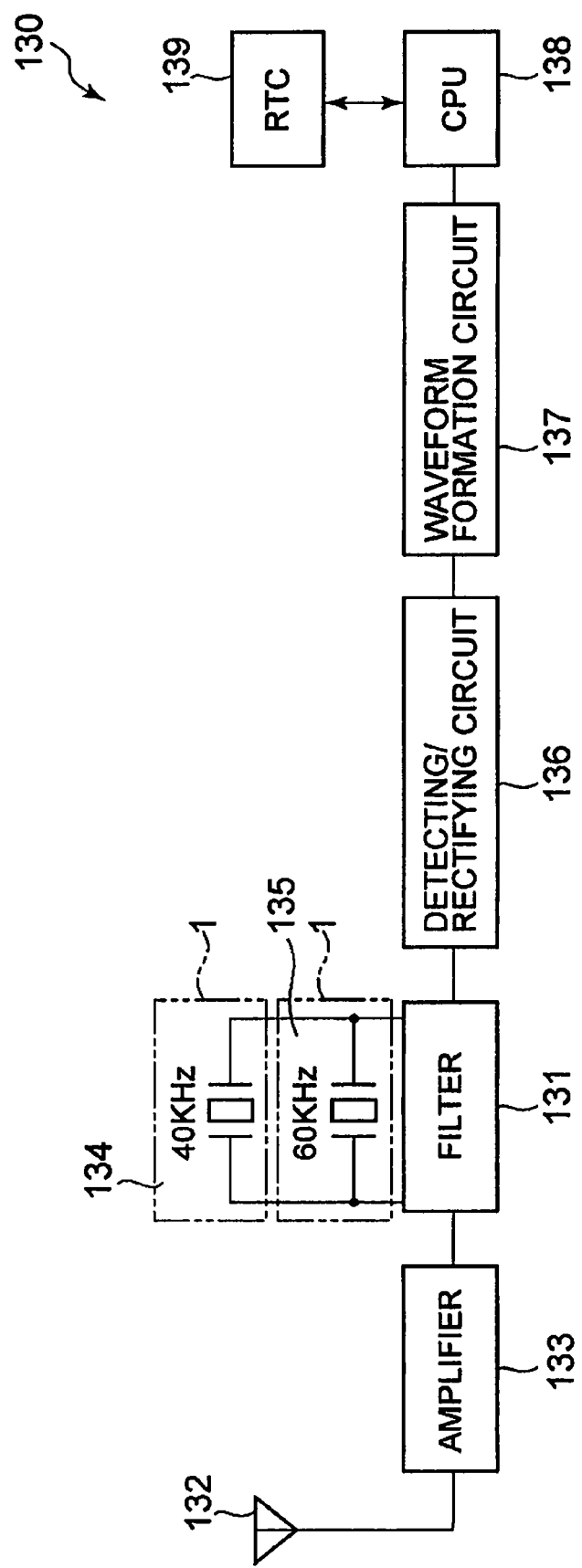
FIG. 14 is a configuration drawing showing an embodiment of a radio clock according to the present invention.

A radio clock 130 in this embodiment includes the piezoelectric vibrator 1 electrically connected to a filtering unit 131 as shown in FIG. 14, and is a clock provided with functions to receive a standard wave including an hour hand data, correct the same to an accurate time automatically and display the same.

In Japan, there are transmitter points (transmitter stations) which transmit the standard wave in Fukushima-ken (40 kHz) and Saga-ken (60 kHz), and these stations transmit the standard waves respectively. Long waves such as 40 kHz or 60 kHz have both a feature to propagate on the ground surface and a feature to propagate while being reflected between the inosphere and the ground surface, it has a large propagation range, and hence Japan is entirely covered by the above-described two transmitter stations.

A functional configuration of the radio clock 130 will be described in detail below.

The antenna 132 receives a long standard wave of 40 kHz or 60 kHz. The long standard wave is generated by AM modulating the hour hand data referred to as a time code into a carrier wave of 40 kHz or 60 kHz. The received long standard wave is amplified by an amplifier 133 and filtered and synchronized by the filtering unit 131 having the plurality of piezoelectric vibrators 1.

The piezoelectric vibrators 1 in this embodiment each include crystal vibrator portions 138, 139 having a resonance frequency of 40 kHz and 60 kHz which is the same as the carrier frequency described above.

Furthermore, a filtered signal having the predetermined frequency is detected and demodulated by a detecting and rectifying circuit 134. Subsequently, the time code is acquired via a waveform shaping circuit 135, and is counted by a CPU 136. In the CPU 136, data such as the current year, the total day, the day of the week, the time is read. The read data is reflected on an RTC 137, and the accurate time data is displayed.

Since the carrier wave is of 40 kHz or 60 kHz, the crystal vibrator portions 138, 139 are preferably vibrators having the tuning fork type structure described above.

The description given above is about the example in Japan and the frequency of the long standard wave is different from overseas. For example, in Germany, a standard wave of 77.5 KHz is used. Therefore, when integrating the radio clock 130 for overseas use into the portable device, the piezoelectric vibrator 1 having a different frequency from Japan is necessary.

As described above, according to the radio clock 130 in this embodiment, since the thinned piezoelectric vibrator 1 is provided, reduction in thickness of the radio clock 130 by itself is achieved. In addition, stable and highly accurate time count is achieved over a long time.

The technical scope of the invention is not limited to the embodiments shown above, and various modifications may be made without departing the scope of the invention.

For example, although the example in which the printed layers are screen-printed on both the base substrate and the lid substrate, and the electrode layer and the bonding layer are printed on the side of the base substrate is given in the respective embodiments describe above, the invention is not limited to this case. In particular, the number of printed layers to be laminated, and the order of lamination among the printed layers, the electrode layer, and the bonding layer are not specifically limited, and may be changed as needed.

Also, a configuration in which the printed layers are screen-printed only on either one of the base substrate or the lid substrate to form the depressions for a cavity is applicable, and a configuration in which the electrode layer or the bonding layer is formed thereon is also applicable.

Although the piezoelectric vibrator having the piezoelectric vibrating strip hermetically encapsulated in the cavity of the package has been described as an example, the electronic device may be formed by hermetically encapsulating elements such as an acceleration sensor or an angular velocity sensor in the cavity instead of the piezoelectric vibrating strip. In this case as well, the package at a high hermeticity and a low cost can be used, so that the high-quality and cost reduction of the electronic device by itself is achieved.

The encapsulated objects to be hermetically encapsulated in the cavities may be batteries, liquid or the like instead of the elements. In other words, the package according to the present invention can be used widely as a container for hermetically encapsulating some encapsulated object. The bonding layer, the electrode layer, the deformed layer and the like may be screen-printed as needed according to the encapsulated object.

What is claimed is:

1. A piezoelectric vibrator comprising:
   a piezoelectric vibrating piece having a base end and a vibrating end; and
   a package formed with an air-tight cavity inside the package for enclosing the piezoelectric vibrating piece, said package comprising:
   a first member having a first surface subjected to no etching;
   a second member having a second surface subjected to no etching;
   a spacer formed of a plurality of laminated printed layers between the first surface of the first member and the second surface of the second member, the spacer being formed with an interior space constituting the air-tight cavity, wherein the laminated printed layers form a depression that have a predetermined depth for protection of the piezoelectric vibrating piece; and
   electrode layers having electrical contact with the piezoelectric vibrating piece and partitioning the plurality of laminated printed layers.

2. The piezoelectric vibrator according to claim 1, wherein the first and second members are made of a glass material.

3. The piezoelectric vibrator according to claim 1, wherein at least one of the first surface and the second surface comprises a flat area at least as extensive as an area occupied by the spacer.

4. The piezoelectric vibrator according to claim 1, wherein at least part of the spacer comprises a printed material baked with one of the first and second members.

5. The piezoelectric vibrator according to claim 1, wherein the package further comprises a bonding layer for bonding the spacer to hold the first and second members together.

6. The piezoelectric vibrator according to claim 5, wherein the spacer is bonded via the bonding layer by anodic bonding.

7. The piezoelectric vibrator according to claim 1, wherein the spacer comprises a first tier formed on the first surface of the first member and presenting a platform for securing the base end of the piezoelectric vibrating piece.

8. The piezoelectric vibrator according to claim 7, wherein the first tier comprises a depression in a location of the vibrating end of the piezoelectric vibrating piece which is deep enough to avoid interference with the vibrating end when the piezoelectric vibrating piece is excessively bent.

9. The piezoelectric vibrator according to claim 8, wherein the package comprises a cushion formed in the depression to come in contact with the piezoelectric vibrating piece when the piezoelectric vibrating piece is excessively bent.

10. The piezoelectric vibrator according to claim 7, wherein the package comprises the electrode layers formed on a second first tier in electrical contact with the piezoelectric vibrating piece.

11. The piezoelectric vibrator according to claim 7, wherein the spacer further comprises a second tier formed on the first tier with an internal space accommodating the piezoelectric vibrating piece therein.

12. The piezoelectric vibrator according to claim 11, wherein the spacer further comprises a third tier formed between the second tier and the second surface of the second member.

13. The piezoelectric vibrator according to claim 12, wherein the third tier comprises a depression in a location of the vibrating end of the piezoelectric vibrating piece which is deep enough to avoid interference with the vibrating end when the piezoelectric vibrating piece is excessively bent.

14. An electronic device comprising the piezoelectric vibrator of claim 1.

15. The electronic device according to claim 14, wherein the electronic device is an oscillator.

16. The electronic device according to claim 14, wherein the electronic device is a radio clock.

* * * * *